United States Patent
Fricker et al.

(10) Patent No.: US 10,777,532 B2
(45) Date of Patent: Sep. 15, 2020

(54) APPARATUS AND METHOD FOR MULTI-DIE INTERCONNECTION

(71) Applicant: Cerebras Systems Inc., Los Altos, CA (US)

(72) Inventors: Jean-Philippe Fricker, Los Altos, CA (US); Philip Ferolito, Los Altos, CA (US)

(73) Assignee: Cerebras Systems Inc., Los Altos, CA (US)

( * ) Notice: Subject to any disclaimer, the term of this patent is extended or adjusted under 35 U.S.C. 154(b) by 0 days.

(21) Appl. No.: 16/743,485

(22) Filed: Jan. 15, 2020

(65) Prior Publication Data

US 2020/0152605 A1 May 14, 2020

Related U.S. Application Data

(63) Continuation of application No. 16/251,522, filed on Jan. 18, 2019, now Pat. No. 10,586,784, which is a continuation of application No. 16/019,882, filed on Jun. 27, 2018, now Pat. No. 10,366,967.

(60) Provisional application No. 62/536,063, filed on Jul. 24, 2017.

(51) Int. Cl.
| | |
|---|---|
| *H01L 23/538* | (2006.01) |
| *H01L 25/065* | (2006.01) |
| *H01L 23/00* | (2006.01) |
| *H01L 21/48* | (2006.01) |
| *H01L 23/58* | (2006.01) |

(52) U.S. Cl.
CPC ...... *H01L 25/0655* (2013.01); *H01L 21/4889* (2013.01); *H01L 23/538* (2013.01); *H01L 23/5386* (2013.01); *H01L 23/562* (2013.01); *H01L 23/564* (2013.01); *H01L 23/585* (2013.01); *H01L 24/43* (2013.01); *H01L 24/48* (2013.01); *H01L 24/94* (2013.01); *H01L 2224/48137* (2013.01)

(58) Field of Classification Search
CPC ................. H01L 21/4814; H01L 21/4885
See application file for complete search history.

(56) References Cited

U.S. PATENT DOCUMENTS

| | | | |
|---|---|---|---|
| 4,932,883 A | 6/1990 | Hsia et al. |
| 4,998,885 A | 3/1991 | Beaman |
| 5,140,405 A | 8/1992 | King et al. |
| 6,281,577 B1 | 8/2001 | Oppermann et al. |
| 6,477,058 B1 | 11/2002 | Luebs et al. |
| 6,936,521 B2 | 8/2005 | Chien |
| 7,681,309 B2 | 3/2010 | Miller |
| 8,316,329 B1 | 11/2012 | Rigby et al. |

(Continued)

OTHER PUBLICATIONS

International Search Report and Written Opinion for PCT Application No. PCT/US2018039700 dated Sep. 13, 2018.

(Continued)

*Primary Examiner* — Cheung Lee
(74) *Attorney, Agent, or Firm* — Jeffrey Schox

(57) ABSTRACT

A semiconductor and a method of fabricating the semiconductor having multiple, interconnected die including: providing a semiconductor substrate having a plurality of disparate die formed within the semiconductor substrate, and a plurality of scribe lines formed between pairs of adjacent die of the plurality of disparate die; and fabricating, by a lithography system, a plurality of inter-die connections that extend between adjacent pair of die of the plurality of die.

20 Claims, 12 Drawing Sheets

(56) References Cited

U.S. PATENT DOCUMENTS

| | | |
|---|---|---|
| 10,468,369 B2 | 11/2019 | Fricker |
| 2002/0185661 A1 | 12/2002 | Kawanobe et al. |
| 2003/0006493 A1 | 1/2003 | Shimoishizaka et al. |
| 2003/0146510 A1 | 8/2003 | Chien |
| 2005/0110160 A1 | 5/2005 | Faroog et al. |
| 2006/0043567 A1 | 3/2006 | Palanduz |
| 2006/0141667 A1 | 6/2006 | Milbrand et al. |
| 2008/0157396 A1 | 7/2008 | Yang |
| 2009/0108441 A1 | 4/2009 | Barr et al. |
| 2011/0147911 A1 | 6/2011 | Kohl et al. |
| 2013/0155796 A1 | 6/2013 | Sugawara |
| 2014/0035093 A1 | 2/2014 | Pincu et al. |
| 2014/0035106 A1 | 2/2014 | Vu et al. |
| 2014/0070423 A1 | 3/2014 | Woychik et al. |
| 2014/0084427 A1 | 3/2014 | Gaskins |
| 2015/0076714 A1 | 3/2015 | Haba et al. |
| 2016/0218057 A1 | 7/2016 | Lee et al. |
| 2017/0084539 A1 | 3/2017 | Gao et al. |
| 2017/0374738 A1 | 12/2017 | Lee et al. |
| 2018/0068938 A1 | 3/2018 | Yazdani |

OTHER PUBLICATIONS

"International Search Report and Written Opinion for PCT Application No. PCT/US18/041090, dated Sep. 19, 2018.", Sep. 19, 2018.
"International Search Report and Written Opinion for PCT Application No. PCT/US18/45519, dated Oct. 26, 2018.", Oct. 26, 2018.

200

Providing a Semiconductor Substrate S210

Identifying a Largest Square S215

Fabricating Circuitry Layers S220

Providing Self-Correcting Mechanisms S222

Providing a Protective Barrier S225

Fabricating Inter-Die Connections S230

Semiconductor Substrate Reduction S240

APPARATUS AND METHOD FOR MULTI-DIE INTERCONNECTION

CROSS-REFERENCE TO RELATED APPLICATIONS

This application is a continuation of U.S. application Ser. No. 16/251,522, filed 18 Jan. 2019, which is a continuation of U.S. application Ser. No. 16/019,882, filed 27 Jun. 2018, which claims the benefit of U.S. Provisional Application Ser. No. 62/536,063, filed 24 Jul. 2017, both of which are incorporated herein in their entireties by this reference.

TECHNICAL FIELD

The inventions described herein generally relate to the computer chip architecture and fabrication field, and more specifically to a new and useful computer chip architecture and computer chip manufacturing methods in the computer chip architecture field.

BACKGROUND

While the concept of artificial intelligence has been explored for some time, the modern applications of artificial intelligence have exploded such that artificial intelligence is being integrated into many devices and decision-making models to improve their learning, reasoning, data processing capabilities, and the like of the devices. The most apparent and broad applications of artificial intelligence include machine learning, natural language processing, computer vision, robotics, knowledge reasoning, planning, and general artificial intelligence.

To be effective, many of the above-noted broad applications of artificial intelligence require the consumption of extremely large data sets in the initial training of the artificial intelligence algorithms (e.g., deep learning algos, recurrent neural networks algos, etc.) being implemented in the specific applications and/or devices (e.g., autonomous vehicles, medical diagnostics, etc.). Because the data sets used in training are often very large and the underlying computer architecture may not be specifically designed for artificial intelligence training, the training of an artificial intelligence algorithm may require thousands of hours of data processing by the underlying computer architecture. While it may be possible to scale or increase the number of computers or servers used in ingesting and processing data sets for training an artificial intelligence algorithm, this course of action often proves to not be economically feasible.

Similar data processing issues arise in the implementation or execution of the artificial intelligence algorithms due to the large amount of data being captured, such as data originating from billions of Internet transactions, remote sensors for computer vision, and the like. The modern remote distributed networked servers (e.g., the cloud) and onboard computer processors (e.g., GPUs, CPUs, etc.) appear to be inadequate for ingesting and processing such great volumes of data efficiently to maintain pace with the various implementations of the artificial intelligence algorithms.

Accordingly, there is a need in the semiconductor space and specifically in the computer chip architecture field for an advanced computing processor, computing server, or the like that is capable of rapidly and efficiently ingesting and processing large volumes of data for at least the purposes of allowing enhanced artificial intelligence algorithms and machine learning models to be implemented. Additionally, these advanced computing systems may function to enable improved data processing techniques and related or similar complex and processor-intensive computing to be achieved.

The inventors of the inventions described in the present application have designed an integrated circuit architecture that allows for enhanced data processing capabilities and have further discovered related methods and architectures for fabricating the integrated circuit(s), packaging the integrated circuit(s), powering/cooling the integrated circuit(s), and the like.

The below-described embodiments of the present application provide such advanced and improved computer chip architecture and related IC fabrication techniques.

SUMMARY OF THE INVENTION

In one embodiment, a semiconductor having multiple, interconnected die, the semiconductor comprises: a substrate comprising a semiconductor wafer; a plurality of die formed with the substrate; a circuit layer formed at each of the plurality of die; and a plurality of inter-die connections that communicatively connect disparate die formed with the substrate, wherein each of the plurality of inter-die connections extends between each pair of adjacent die of the plurality of die.

In one embodiment, the semiconductor wafer comprises a singular, integrally continuous form, and the plurality of die are formed integrally and continuously with the singular, integrally continuous form of the semiconductor wafer.

In one embodiment, the semiconductor includes a plurality of scribe lines, wherein each scribe line of the plurality of scribe lines is positioned at the substrate between each pair of adjacent die of the plurality of die, wherein each of the plurality of inter-die connections extends over one scribe line of the plurality of scribe lines positioned between each pair of adjacent die of the plurality of die.

In one embodiment, each of the plurality of die comprises a protective barrier comprising a seal ring that surrounds active circuit regions of each of the plurality of die.

In one embodiment, the seal ring extends between the circuit layer of each of the plurality of die and intersecting edges of side faces and a top surface of each of the plurality of die.

In one embodiment, each end of each of the plurality of inter-die connections extends to a position on a top surface of each pair of adjacent die of the plurality of die, and each of the plurality of inter-die connections operably connects the circuit layers of each pair of adjacent die.

In one embodiment, the semiconductor includes a plurality of peripheral connections distinct from the plurality of inter-die connections are formed along at least one side of a subset of the plurality of die positioned along an outer periphery of the semiconductor.

In one embodiment, each of the plurality of inter-die connections comprises a conductive material that enables a transmission of signals thereon between circuit layers of adjacent die of the plurality of die.

In one embodiment, each of the plurality of inter-die connections comprises a conductive material that is the same as the conductive material forming intra-die connections on the circuit layer of each die.

In one embodiment, the plurality of die are integrally formed with and maintained integrally with the substrate without dicing each of the plurality of die from each other.

In one embodiment, the plurality of die include: (i) a first subset of interior die defining an interior of the semiconductor substrate, wherein the first subset of interior die have inter-die connections with adjacent die along all sides of the first subset of die; (ii) a second subset of peripheral die defining a periphery of the semiconductor substrate, wherein at least one side of each of the second subset of exterior die are formed without inter-die connections.

In one embodiment, a method of fabricating a semiconductor having multiple, interconnected die includes providing a semiconductor substrate having: a plurality of disparate die formed within the semiconductor substrate, and a plurality of scribe lines formed between pairs of adjacent die of the plurality of disparate die; and fabricating, by a lithography system, a plurality of inter-die connections that extend between adjacent pair of die of the plurality of die.

In one embodiment, the method of fabricating the semiconductor includes providing a protective barrier at each of the plurality of die that encompasses non-fabrication surfaces of each of the plurality of disparate die.

In one embodiment, the method of fabricating the semiconductor includes identifying a largest usable geometry of the semiconductor substrate that includes an array or subset of the plurality of die; and fabricating a circuitry layer only at each of the plurality of die within the identified largest usable geometry.

In one embodiment, the method of fabricating the semiconductor includes fabricating one or more circuitry layers on each of the plurality of die.

In one embodiment, each of the plurality of inter-die connections extend from a first circuitry region of a first die of each adjacent pair of die to a second circuitry region of a second die of each adjacent of pair of die.

In one embodiment, fabricating the plurality of inter-die connections includes: setting a position of a die reticle offset a center of each die of each adjacent pair of die; setting the die reticle overlapping a first circuitry region of a first circuitry region of a first die of each adjacent pair of die and a second circuitry region of a second die of each adjacent of pair of die, wherein the die reticle comprises geometries for forming the plurality of inter-die connections; and upon setting the die reticle into position, exposing by the lithography system the die reticle thereby forming the plurality of inter-die connections between adjacent pair of die.

In one embodiment, fabricating the plurality of inter-die connections includes: setting a position of a first die reticle centered with a first die of each adjacent pair of die; setting a position of a second die reticle centered with a second die of each adjacent pair, wherein the position of the second die reticle overlaps a portion of the first die reticle, and wherein the first die reticle and the second die reticle comprise geometries for forming the plurality of inter-die connections between each adjacent pair of die; upon setting the first die reticle into position, exposing by the lithography system the first die reticle thereby forming a first portion of each of the plurality of inter-die connections between adjacent pair of die; and upon setting the second die reticle into position, exposing by the lithography system the second die reticle thereby forming a second portion of each of the plurality of inter-die connections between adjacent pair of die.

In one embodiment, exposing the second die reticle builds the second portion comprising a second layer of conductive material that overlaps the first portion comprising a first layer of conductive material, and each of the plurality of inter-die connections is defined by the overlap of the first layer and the second layer.

In one embodiment, a width of an overlapping portion of the first and second layers are diminished relative to a width of the non-overlapping portion of non-overlapping portions of each of the first and second layers.

DESCRIPTION OF THE PREFERRED EMBODIMENTS

The following description of preferred embodiments of the present application are not intended to limit the inventions to these preferred embodiments, but rather to enable any person skilled in the art of to make and use these inventions.

Overview

Traditional integrated circuit manufacturers may prepare a single silicon wafer with many die formed on the silicon wafer. Once each die is formed on the silicon wafer, the integrated circuit manufacturer may then separate each die on the silicon wafer by physically cutting the wafer and having each die separately packaged into a chip. In some cases, the manufacturer may install several of those disparate or separate chips onto a same printed circuit board (PCB) to form an assembly and provide connections between the disparate chips so that they may communicate across the PCB assembly. The communication connections between the chips may typically be found in the PCB. However, when a multi-chip PCB is manufactured in this manner, the communication between disparate chips thereon becomes limited by the amount connectivity or bandwidth available in a given connection between the disparate chips because the chips are in indirect communication via the PCB. The bandwidth across chips (e.g., off-chip communication) formed on separate pieces of silicon may be multiple orders of magnitude lower compared to chips that remain and communicate on a same piece of silicon or die.

The embodiments of the present application provide technical solutions that resolve connectivity, communication, and bandwidth issues of traditional integrated circuits and mainly, arising from integrated circuits manufactured on separate pieces of silicon (e.g., off-die integrated circuits). The technical solutions of the embodiments of the present application enable multiple die to be maintained on a same or single substrate (e.g., a wafer) without partitioning away each die in a wafer cutting process and further, while also establishing direct communication connectivity between adjacent die on the single substrate. Accordingly, the embodiments of the present application function to provide die-to-die connectivity on a single substrate or wafer.

The resulting substrate, however, has multiple die and consequently becomes a very large computer chip. Therefore, a number of technical problems relating to operational yield of the die on the large chip, packaging of the large chip, and powering/cooling of the large chip must also be solved.

1. An Integrated Circuit Wafer with Inter-Die Connections

Figure 1:
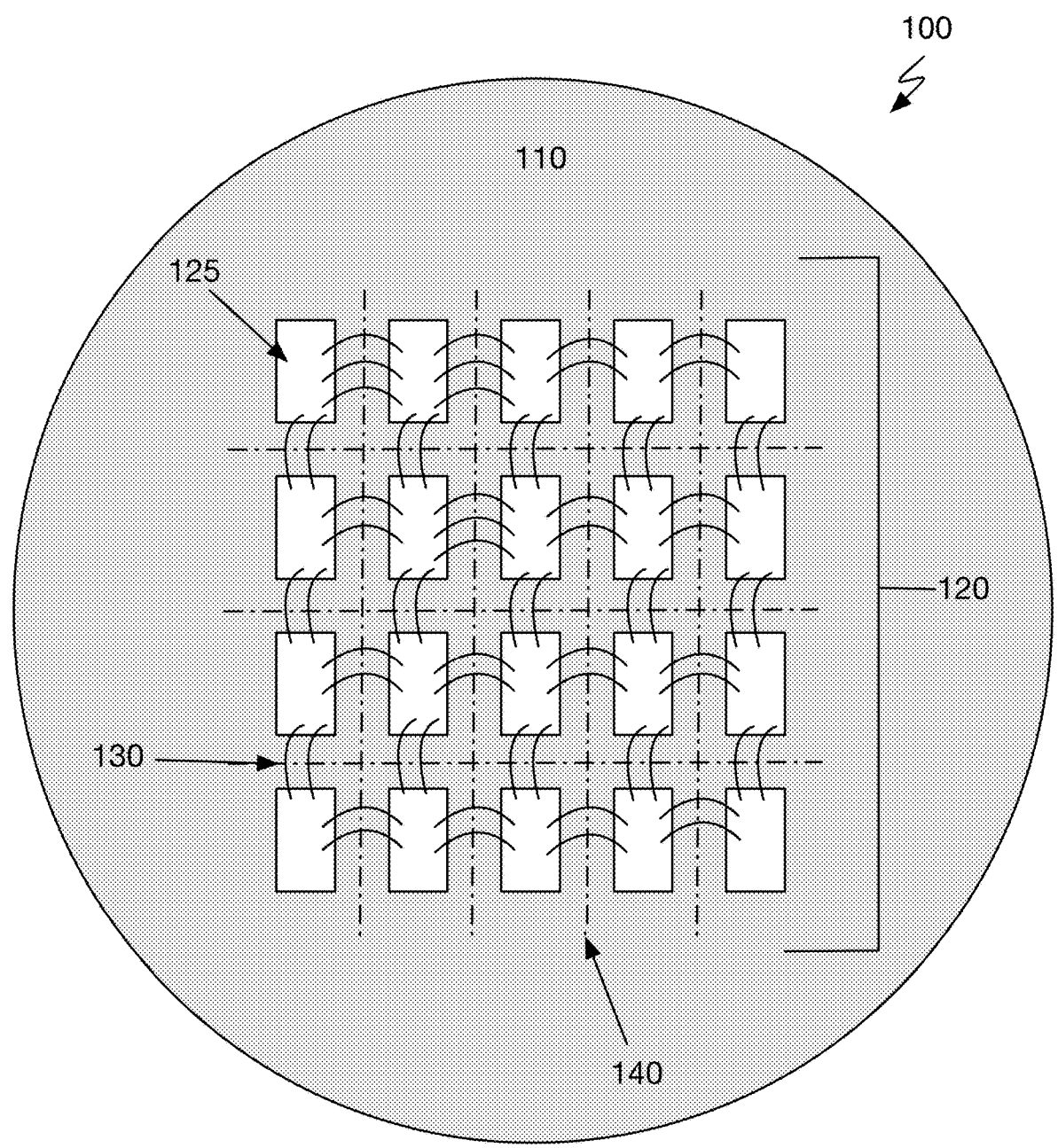
FIG. 1 is a schematic of a system 100 in accordance with one or more embodiments of the present application.

As shown in FIG. 1, the semiconductor 100 illustrates an example integrated circuit that includes a substrate 110, a plurality of die 120 formed with the substrate 110, a circuit layer 125, a plurality of inter-die connections 130, scribe lines 140, and input/output connects 150.

The semiconductor 100 may be manufactured using any suitable lithography system and/or method that is configured to implement the one or more steps of the methods described herein, including method 200.

The semiconductor 100 functions to enable inter-die communications between the plurality of die 120 formed with the single substrate 110. The inter-die connections 130 formed between adjacent die on the substrate 110 improves communication bandwidth and enables a reduction in communication latency between connected die on the substrate 110 because communication between each of the plurality of die 120 is maintained on a same large die (e.g., on-die communication). That is, the inter-die connections 130 formed between the plurality of die 120 effectively eliminate a need to for a first die of the plurality of die 120 to go off-die (which increases latency due to transmission of signals using an intermediate off-die circuit) to establish communication with a second die of the plurality of die 120 since the first and the second die may be directly connected with one or more inter-die connections or, at a minimum, indirectly connected via intermediate inter-die connections established between one or more die between the first and the second die. Such configuration(s), therefore, enabling increasedly faster communications and data processing between die when compared, at least, to communications between die not maintained on a same substrate (e.g., a same wafer). Each of the plurality of die 120 remain on the single substrate 110 and are not cut from the substrate 110 into individual die for separate packaging into an individual computer chip. Rather, at formation, only excess die (e.g., die that are not provided with circuitry or inactive die) along a periphery of the substrate no are preferably removed from the substrate 110 and the remaining portions of the substrate 110 having the plurality of die 120 (e.g., active die) may form a predetermined shape (e.g., a rectangular shape) with the substrate 110. The resultant substrate 110 after being reduced to shed excess die and potentially following one or more additional refinement or IC production processes may then be packaged onto a board (e.g., a printed circuit board (PCB) or an organic substrate).

The substrate 110 is preferably a wafer or a panel into and/or onto which die having a circuitry layer 125 on which active microelectronic devices may be built. The circuitry layer typically defines one or more surfaces on a die onto which circuits and various microelectronic devices may be fabricated using a lithography system. The substrate 110 is preferably formed of a silicon material (e.g., pure silicon), but may be additionally or alternatively formed of any suitable material including silicon dioxide, aluminum oxide, sapphire, germanium, gallium arsenide, an alloy of silicon and germanium, indium phosphide, and the like. The substrate 110 may be a virgin wafer. Alternatively, the substrate 110 may include one or more layers formed therein where the one or more layers may include, but not limited to, a photoresist, a dielectric material, and a conductive material. The photoresist being light-sensitive material may include any material that may be patterned by a lithography system. The photoresist may be positive photoresist or negative photoresist.

Accordingly, the substrate 110 may be formed of any thin slice of semiconductor material that may be used for fabrication of integrated circuits having varying diameters and shapes, but preferably the substrate 110 is formed in a circular shape and with a diameter of 300 mm.

The lithography system may refer to any lithography system that prints images of a reticle onto a substrate (e.g., a wafer) using light. The lithography system may be a scanning projection system or a step and scan system, which may be alternatively referred to as a scanner or a stepper. The lithography system may include any suitable exposure system including one or more of optical lithography, e-beam lithography, X-ray lithography, and the like.

The microelectronic devices, such as transistors, diodes, various circuits, and the like may be formed into and/or over the substrate 110 using lithographic processes (e.g., optical lithography, etc.).

Each of the plurality of die 120 may be a block of semiconducting material on which circuits may be fabricated. Each of the plurality of die 120 may be formed by an exposure process of silicon material of or on the substrate 110 and typically in a rectangular shape or square shape. However, it shall be noted that the die 120 may take on any suitable form including any geometric and non-geometric forms. Other than excess die that is removed from the substrate 110 during a substrate reduction process, the plurality of die 120 are not cut or diced from the substrate 110 into individual die.

Additionally, each of the plurality of die 120 includes an alignment point preferably at a center of each die. The alignment point may be used by the stepper of the lithographic system to align the photomask and/or photoreticle with respect to each of the plurality of die 120 before an exposure process. Further, each of the plurality of die 120 may include a seal ring surrounding or covering a periphery (perimeter) of each of the die other than the circuitry layer (e.g., circuit fabrication surface) of each die. Accordingly, the seal ring may be provided at the side surfaces of each die which extend in a normal direction (i.e., perpendicular) with respect to the surface of the substrate 110 and further, located adjacent scribe lines 140. Additionally, or alternatively, a section of the seal ring surrounding each die may be formed at a top surface of each die immediately beyond the edges where each side face and the top surface of each die intersects. In such embodiments, the seal ring may additionally be formed immediately beyond the intersecting edges of each die at the top surface but before reaching a circuit layer 125 of each die. That is, the seal ring may additional cover an area of a die between an outer periphery of the circuit layer 125 of a die and the edges where the top surface intersects with each respect side face of the die. The circuit layer 125 of each may include active circuits formed and/or positioned on a top surface (or bottom surface depending on perspective) of each die. The seal ring preferably functions to stop or mitigate propagation of damage and/or cracks in the structure of the semiconductor 100 into a respective die 120. Cracks and/or damage in the structure would otherwise allow contaminates to enter an active area (e.g., active circuitry layer or the like) of a die and potentially alter the die's functionality and/or performance, including tearing apart electrical and/or semiconductive connections.

Figure 3A:
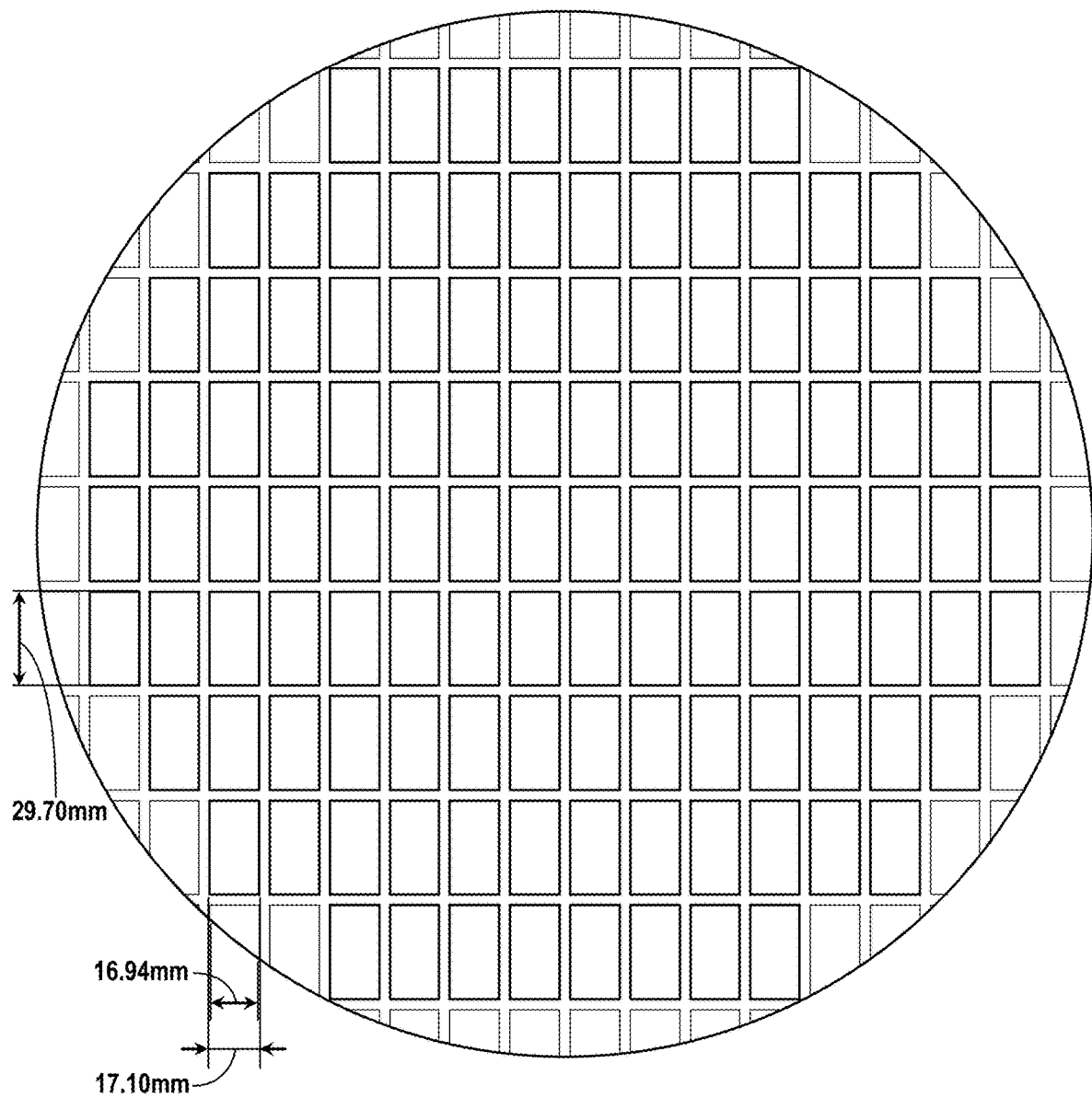
FIG. 3A-3D illustrate several schematics of a semiconductor substrate without and with interconnections in accordance with one or more embodiments of the present application.
Figure 3B:
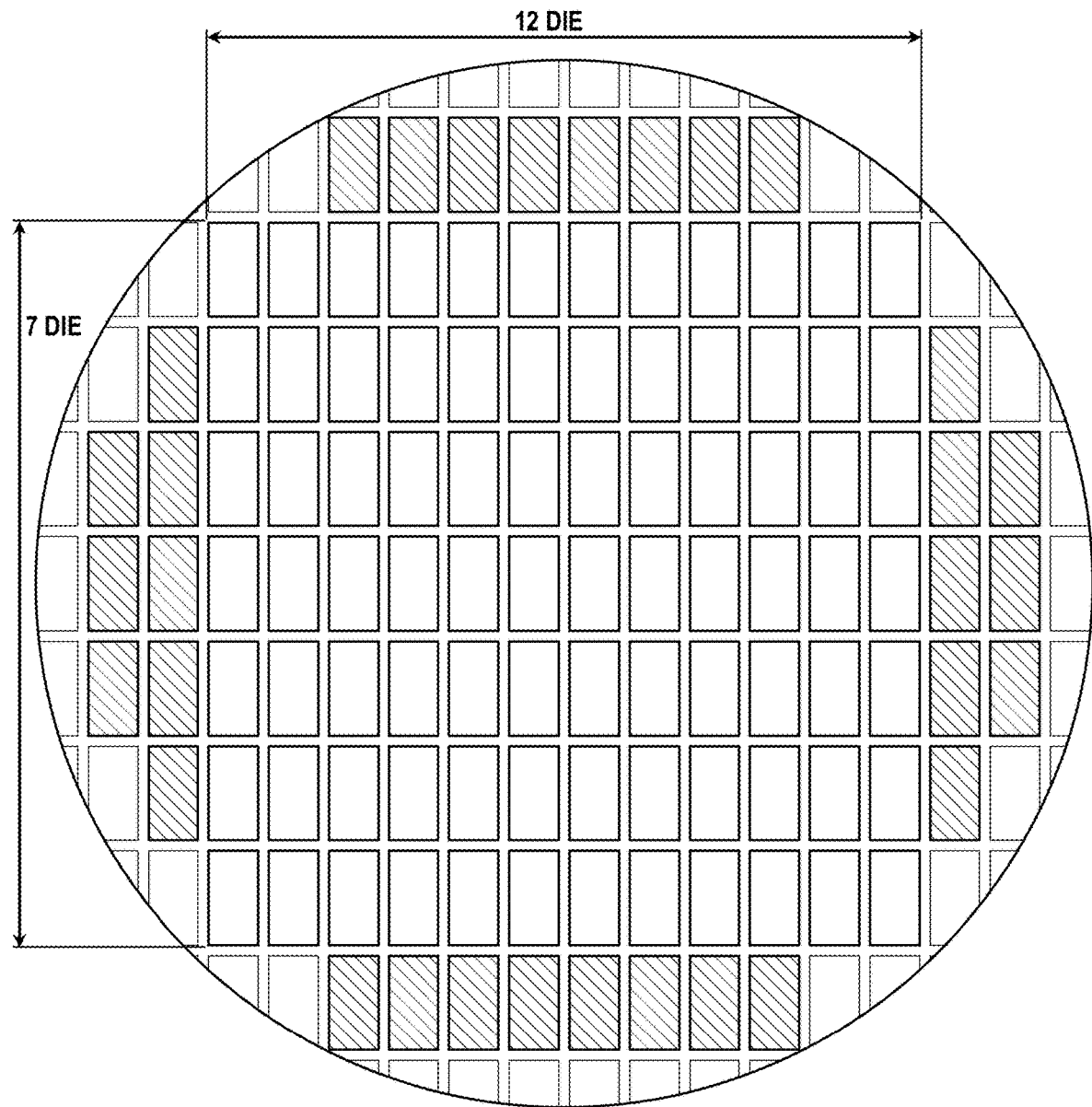
Figure 3C:
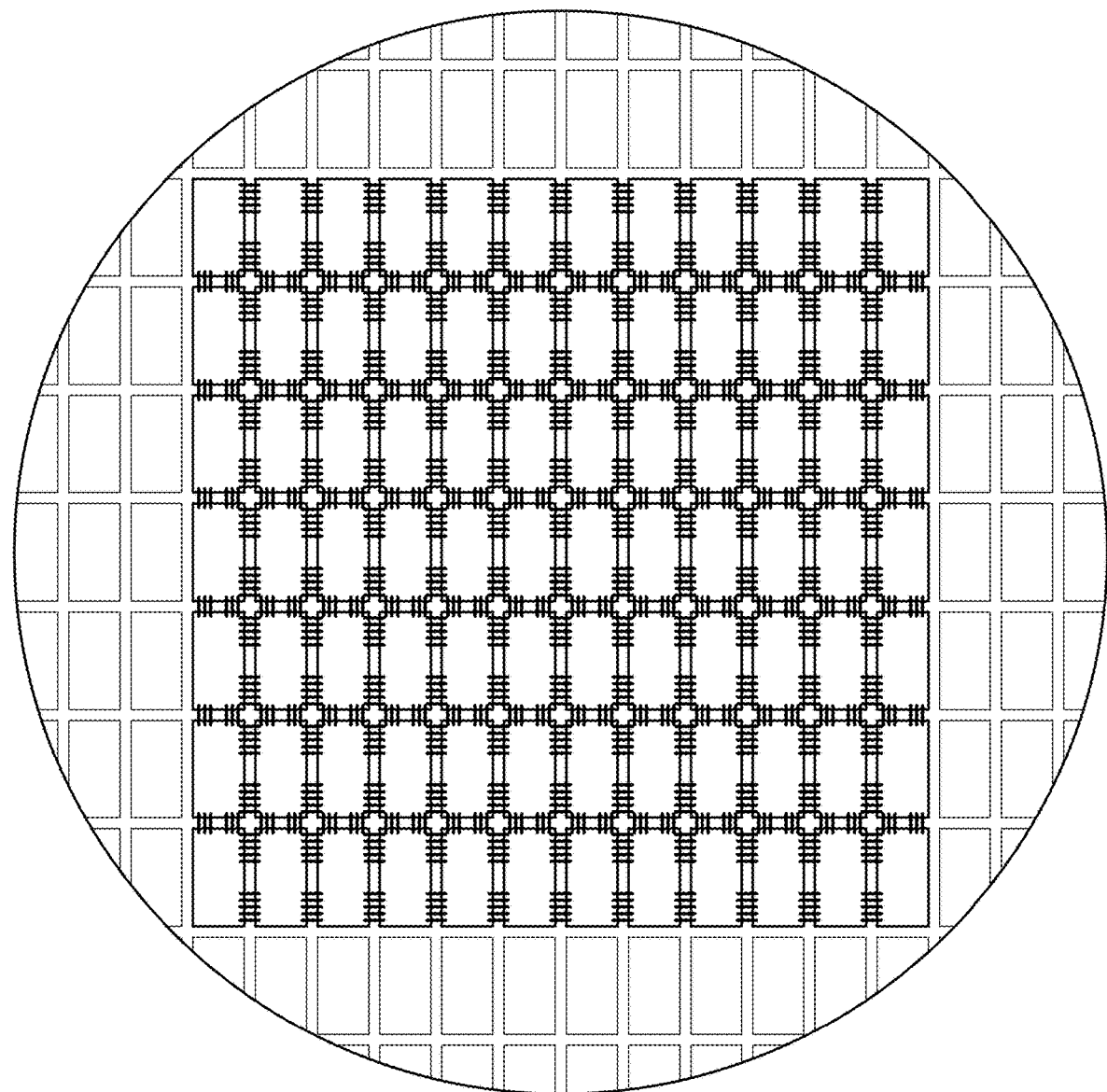

As shown in FIG. 3C, the plurality of inter-die connections 130 function to connect, at least, any two circuits (e.g., the inter-die connections may connect a transmitting circuit and receiving circuit of two die, respectively) between two die of the plurality of die 120 on the substrate 110. That is, each inter-die connection 130 may be formed or provided to extend from a first die to a second die located on the substrate 110. Preferably, an inter-die connection 130 may be formed between two adjacent die. Each inter-die connection may be formed of a material having a length and an endpoint at each respective end of the length of material (e.g., two endpoints), where each respective endpoint of an inter-die connection may terminate at a circuitry layer of a different die on the substrate 110. Accordingly, each respective endpoint of an inter-die connection may function to extend to a position on a surface of a pair of die (preferably adjacent but can be any two die) beyond a position of the seal ring on each of the pair of die.

In the case that the die are formed in a rectangular or similar geometric or substantially geometric shape, the inter-die connections 130 may extend between two parallel or substantially parallel surfaces of the two-adjacent die. Accordingly, it is possible for a single die of the plurality of die 120 to be connected to more than one die depending on the positioning of the die in the array of die on the substrate 110. When positioned in an interior of the substrate 110, the single die of the plurality of die 120 may be adjacent to four other die having at least one surface that is parallel to one of the four side surfaces of the single die where one or more inter-die connections 130 may be formed. It shall be understood that while in preferred embodiments it is described that the die may be formed as a rectangle (or other polygon), the die may be formed in any shape or manner suitable for preparing an integrated circuit including non-traditional, non-geometric or non-polygonal shapes.

The plurality of inter-connections 130 (global wires) are preferably wires or traces that function to conduct signals across two die. The plurality of inter-connections 130 are preferably formed of a same conductive material used to form intra-die connections (or local wires) between circuit elements of a single die. Additionally, or alternatively, the plurality of inter-die connections 130 may be formed of any suitable conductive material that may be the same or different from materials forming other wires on a die or that may be the same or different from materials forming the circuits on the die.

In a first implementation, the plurality of inter-die connections 130 may be formed by offsetting the stepper of a lithographic system a predetermined distance from a center or alignment point of a single die sufficiently to allow an exposure to be performed for and between two adjacent die rather than an exposure focusing on the circuitry layer 125 of an individual die. Consequently, the exposure(s) that provides the inter-die connections 130 may be formed over the scribe lines 140. Additionally, the endpoints of an inter-die connection 130 may be positioned or formed at interior position relative to a location of the seal ring of a die. Accordingly, while the inter-die connections 130 may be formed at any suitable location between two die, the inter-die connections may be typically formed such that the respective endpoints of an inter-die connection 130 are positioned inwardly of the seal ring of the die on which it terminates such that each respective endpoint of an inter-die connection 130 is positioned at some location between the seal ring and a center of the respective die. In a preferred embodiment, each respective endpoint of an inter-die connection may be positioned on the circuit layer 125 of each respective die of a pair of interconnected die. However, it shall be noted that the respective endpoints may be positioned ahead of the circuit layer 125 of each but still inwardly towards a center of the die beyond a position of the seal ring.

In a second implementation, the plurality of inter-die connections 130 may be formed using a multi-exposure process in which exposures for creating the circuitry layer and the inter-die connections 130 are maintained in alignment while exposing a layer of photoresist multiple times. While in alignment, the exposure configured for creating the inter-die connections 130 preferably has a (slightly) larger geometry and/or size than the die. In this way, this area of a die having the inter-die connections 130 may be exposed multiple times (e.g., a double exposure).

Accordingly, in some embodiments, the first implementation and the second implementation for creating the inter-die connections 130 may be combined to achieve the inter-die connections throughout a same substrate 110.

The scribe lines 140 (or saw street) function to indicate a location between two disparate die on the substrate 110 where the substrate 110 would typically be cut for forming individual die. The scribe lines 140 may typically be centered between a pair of die or adjacent die and in many cases, have a width similar to a width of a saw used for cutting wafers and the like. Accordingly, each scribe line 140 may extend longitudinally and/or latitudinally along a surface of the semiconductor 110 and typically extend parallel with or substantially parallel with side surfaces of the die. In a preferred embodiment, no circuitry or other device elements would be formed on or over the scribe lines 140, as these elements would most likely be severed or damaged during a cutting process of the substrate 110. In a traditional die production process, however, some testing structures or testing devices may exist near or at the scribe lines and these testing structures may be used for testing the circuitry or process prior to dicing die on a wafer into individual pieces.

The input/out (I/O) connections 150 (or fanouts) preferably enable the array of interconnected die 120 of the semiconductor 100 to interact with off-die devices and/or devices external to the semiconductor 100. Preferably, the I/O connections 150 may be formed and/or arranged along one or more sides of the plurality of die 120. In such preferred embodiments, the I/O connects 150 may be formed along a side of the plurality of die 120 where the plurality of die 120 are without an adjacent die. That is, the plurality of die 120 may include a subset of die forming an interior and another subset of die forming an outer periphery of the plurality of die 120. While, in some embodiments, the subset of die forming the outer periphery of the plurality of die 120 have inter-die connections at one or multiple side surfaces with adjacent die, these outer peripheral die may also have side surfaces which do not have inter-die connections to adjacent die because there are no other die beyond these outer peripheral die.

The I/O connections 150 may be formed using a same exposure technique and/or a same conductive material as used in fabricating the inter-die connections 120. It shall be noted that the I/O connections 150 may be fabricated using any suitable method and/or signal transmitting material.

2. Method of Producing an Integrated Circuit Wafer with Inter-Die Connections

Figure 2:
FIG. 2 is a method 200 in accordance with one or more embodiments of the present application.

As shown in FIG. 2, a method 200 for producing or fabricating a large semiconductor having a plurality of die and a plurality of inter-die connections includes providing a semiconductor substrate S210, fabricating one or more circuitry layers on a plurality of die of the substrate S220, fabricating a plurality of inter-die connections S230, and reducing a size of the semiconductor substrate. The method 200 may optionally or alternatively include identifying a largest square of the substrate S215, providing self-correcting mechanisms to the die S222, and providing a protective barrier encompassing portions of the plurality of die S225.

Generally, the method 200 enables the fabrication of a large die for a large integrated chip. The method 200 provides a wafer onto which a plurality of die are formed and are maintained on the same wafer. That is, the plurality of die onto which circuitry are provided via a lithography process are not cut or diced either individually or in groups away from any other of the plurality of die having circuitry on the wafer. The method provides inter-die (e.g., between die) connection techniques that allow for fabrication or installation of signal conducting wires or traces between at least two die on the wafer. The method 200 may implement the inter-die connection techniques between all or substantially all pairs of die existing on the wafer such that communication between any two die across the entire board may be achieved. A technical advantage of such method and resulting configuration is enhanced communication bandwidth and reduce latency in communication between the plurality of interconnected die. That is because the inter-die connections established between each pair of die on the wafer enable direct or sometimes indirect communication channels that stay on-die (as previously discussed in section 1) rather than off-die. Accordingly, such configuration enables data to be processed multiple orders faster (e.g., improved throughput) than in traditional chip architecture. Additionally, one or more implementations of the method 200 accomplishes the inter-die connections without using stitching techniques that are known in the art.

S210, which includes providing a substrate, functions to provide a substrate to a lithography system for building an integrated circuit. The substrate is preferably a wafer but may be any semiconductor material that may be used in manufacturing a semiconductor device, such as a panel or the like. The wafer provided to the lithography system may be any standard size wafer ranging from 25 mm to 450 mm or non-standard size wafer. S210 may provide the wafer to a wafer stage or other wafer mounting surface of the lithography system.

In one example, S210 may provide a circular or substantially circular wafer being approximately 300 mm in size. In such example, the wafer preferably includes a plurality of die each having a gross size of 17.1×30.0 mm (e.g., exposure pitch), as shown in FIG. 3A. The exposable surface of the wafer, however, may be slightly smaller than the gross exposure pitch of a die. The exposable surface of the wafer may include any or all surface portions of the wafer; however, in a preferred embodiment, the exposable surface preferably includes the surfaces of the wafer that fits within an optimal (or selected) geometry (e.g., a rectangle, a square, etc.). Additionally, or alternatively, between each pair of die (along a planar surface of the die) may be included a scribe line indicating a location at which a saw may be used to safely cut the wafer without damaging a die. It shall be noted that while each wafer provisioned to the lithography system may include or identify scribe lines, this method preferably avoids individually cutting the wafer to separate the die with circuitry fabrication into individual die. Rather, the scribe lines of the wafer may be used to reduce excess (or unused) die from the wafer while maintaining the die with circuitry fabrications of the wafer. That is, the scribe lines along a periphery of the wafer may be used to reduce the wafer to an optimal or selected geometry once the plurality of die have been exposed and may be ready for a subsequent process, such as packaging, etc.

S210 may additionally provide a protective barrier or seal ring encompassing the non-fabrication surface(s) or non-circuitry layer of each of the plurality of die of the wafer. The dimensions of the seal ring may incidentally reduce, by a small amount, the available circuitry fabrication surface of each of the plurality of die. In some embodiments, the protective barrier may not be formed along exterior side surfaces of subset of the plurality of die forming an outer periphery thereof.

Prior to performing an exposure of the wafer, S215 optionally includes identifying a largest usable geometry of the wafer. A preferably geometry of each of the plurality of die of the wafer is preferably a rectangle (or square). In such case, S215 functions to identify a largest square array of die that will be used during circuitry fabrication on each die. For example, a typical 300 mm wafer may include a total of one hundred (100) total die. In such example, in identifying a largest square array of die, S215 may identify only eighty-four (84) full die in a 12 die×7 die square configuration, as illustrated in FIG. 3B. A technical advantage of such square configuration is that workloads for implementing artificial intelligence (AI) machine learning algorithms and the like is made easier with a square configuration.

Accordingly, as shown in FIG. 3B, S215 functions to identify an optimal fabrication area (including full die) of the wafer to be used in circuitry fabrication and consequently, areas of the wafer outside of the optimal fabrication region that will be cut from the wafer in a reduction process.

S220, which includes forming a circuitry layer, functions to produce one or more circuitry layers on each of the plurality of die in a fabrication region (as defined in S215) of the wafer by exposing a surface of each of the plurality of die using a lithography system. The circuitry layer of each of the plurality of die may be formed to include any number and type of circuitry and/or microelectronic devices, such as a plurality of logic devices and transistors. The logic devices of the circuitry layer of each die may include normal operating logic for a given die as well as redundancy logic devices that allow a given die on the wafer to repair itself.

S222, which optionally includes providing self-correcting mechanisms to the die, functions to provide logic devices to the circuitry layer of the die that function to mitigate yield problems associated a large wafer having a plurality of interconnected die. In a traditional chip manufacturing process, each die formed on a wafer may be diced and individually packaged into a single chip. Thus, if the single chip malfunctions in some manner, the malfunctions are isolated to the single chip. This may be ideal in the circumstance of a multi-chip board. By contrast, in a preferred embodiment of this application, multiple die are maintained (i.e., not diced) on a single large wafer. In such embodiment, when one or more die on the single large multi-die wafer malfunctions, the malfunctioning of the one or more die may affect or propagate through to neighboring and/or indirectly interconnected die. In such circumstance, the malfunctioning of one or more die on the single large multi-die wafer may be compounded throughout the single large multi-die wafer due to the interconnection of the multiple die and reliance on connected die for signal throughput.

Accordingly, the malfunctioning of a single die or more of a single large multi-die wafer may compoundly reduce the yield of the large wafer. To address this technical problem, S222 functions to fabricate and/or provide within each die self-correcting mechanisms that function to correct problems that arise with each die. Preferably the self-correcting mechanisms include logic devices, such as redundancy logic devices that function to enable a die to self-repair a malfunction or, at least, continue functioning through different mechanisms provided by the redundancy logic devices.

S220 includes providing to a stepper or scanner of the lithography system photoreticles or photomasks for each layer of circuitry that is desired for each of the plurality of plurality of die. The photomasks may be used to specifically expose with a light source certain geometries in a photoresist layer provided to a fabrication surface of each die. As in traditional lithography processes, the exposed portions of the photoresist layer may be etched or washed away while the remaining unexposed areas are maintained. The remaining silicon layer that was not etched away may be used to define a circuitry layer. In a preferred embodiment, the photomask used for exposing geometries onto the photoresist layer of the wafer has a shape and dimensions similar to or matching that of a single die. In such case, a single shot exposure using a given photoreticle may typically be sufficient to define a circuitry layer on a fabrication surface of a given die on the wafer. However, as discussed below with respect to the exposure and fabrication of the inter-die connections or wires, it may be possible to use an enlarged photoreticle that is capable of exposing a circuitry layer within a fabrication surface or region of a die and additionally and/or separately, expose a region between a pair of die to provide inter-die connectivity (e.g., add signal wires).

Optionally, S225, which includes providing a protective barrier or seal ring, functions to expose an area surrounding a given die on the wafer to protect the die from potential contaminates that may permeate into the die. The seal ring may additionally be used to define a fabrication region for a given die, in that, the areas of the die that are not encompassed by the seal ring may typically be used for deposition of material for fabricating circuitry. In many instances, the fabrication region for a die may a surface of the die that is perpendicular to an exposure device of the lithography system. However, it shall be noted that any surface of a given die may be used as a suitable fabrication surface.

The provisioning of the protective barrier (S225) may be performed preferably contemporaneously (e.g., at a same time) with the fabrication of the circuitry layers of the die. Additionally, or alternatively, the protective barrier may be provided to the die to avoid or reduce any potential contamination from various chip manufacturing processes, such as a wafer reduction process or the like. In several embodiments, the seal ring defines an area within a die (e.g., the circuitry layer) onto which circuits and other devices may be formed onto the die. Additionally, this area defined by the seal ring may also accommodate one or more endpoints of the inter-die connections (e.g., the endpoints of the inter-die connections may be formed on the circuitry layer defined by an inside area of the seal ring.

S230, which includes fabricating a plurality of inter-die connections, functions to provide connectivity and/or communication means between circuitry layers of a first circuitry region of a first die of a die pair and a second circuitry region of a second die of the same die pair. An inter-die connection may refer to or relate to a physical connection established between two die on a same wafer. In a preferred embodiment, the inter-die connection may include a single wire or trace that extends from a circuit of a first die to a circuit of a second die. The inter-die connection is preferably established using a same lithography system used in fabricating the circuitry layers and intra-die (e.g., within die wires) connections of each of the plurality of die on the wafer. That is, the inter-die connection may be manufactured between die by implementing the lithography system to expose an area between the die that also includes surfaces portions of each of the die defining the area between.

S230 may be implemented before or after the intra-die connections are fabricated using the lithography system. Alternatively, the exposure and fabrication of the intra-chip wires and the inter-die connections may be performed contemporaneously or at a same time. Preferably, S230 implements an exposure and fabrication of the inter-die connections once the circuitry layer(s) of the die as well as the intra-chip wires of the die are complete. In this way, the lithography system may necessarily adjust its position relative to a die only after the circuitry and wires of the die are in place. In this way, realignment of the lithography system to a center or alignment point(s) of a die is not required.

S230 includes providing a photoreticle to a stepper or scanner of the lithography system that includes geometries for exposing photoresist layers or the like for fabricating the inter-die connections. The geometries for each inter-die connection may be sufficiently long enough to extend from one surface of a first die to a second surface of a second die. Accordingly, an extent or length dimension of given inter-die connections may be depend, in part, on a pitch or distance between circuitry surfaces of two die communicatively connected using the inter-die connections.

Additionally, or alternatively, S230 may include multiple exposures implemented using multiple photomasks to achieve connectivity between different circuits of a pair of die. In some instances, it may be necessary to provide inter-die connections that extend higher in height and/or longer in length than some inter-die connections.

Preferably, S230 functions provide inter-die connections by exposing areas between each pair of die on the substrate such that the ends of each inter-die connection straddle single rings of the die. That is, each end of an inter-die connection may be fabricated such that it is positioned inwardly of an encapsulation of the respective seal rings the respective die pair that is being connected.

Since S230 functions to provide the inter-die connections between the die pair on the un-partitioned substrate, each of the inter-die connections is fabricated such that a portion of the extension of the inter-die connections extends over scribe lines that extend, in parallel, with side surfaces of and between a pair of die.

Additionally, S230 may function to configure the lithography system to enable the exposure for fabricating the inter-die connections outside of the circuitry layer or circuitry fabrication regions of the die.

Figure 4A:
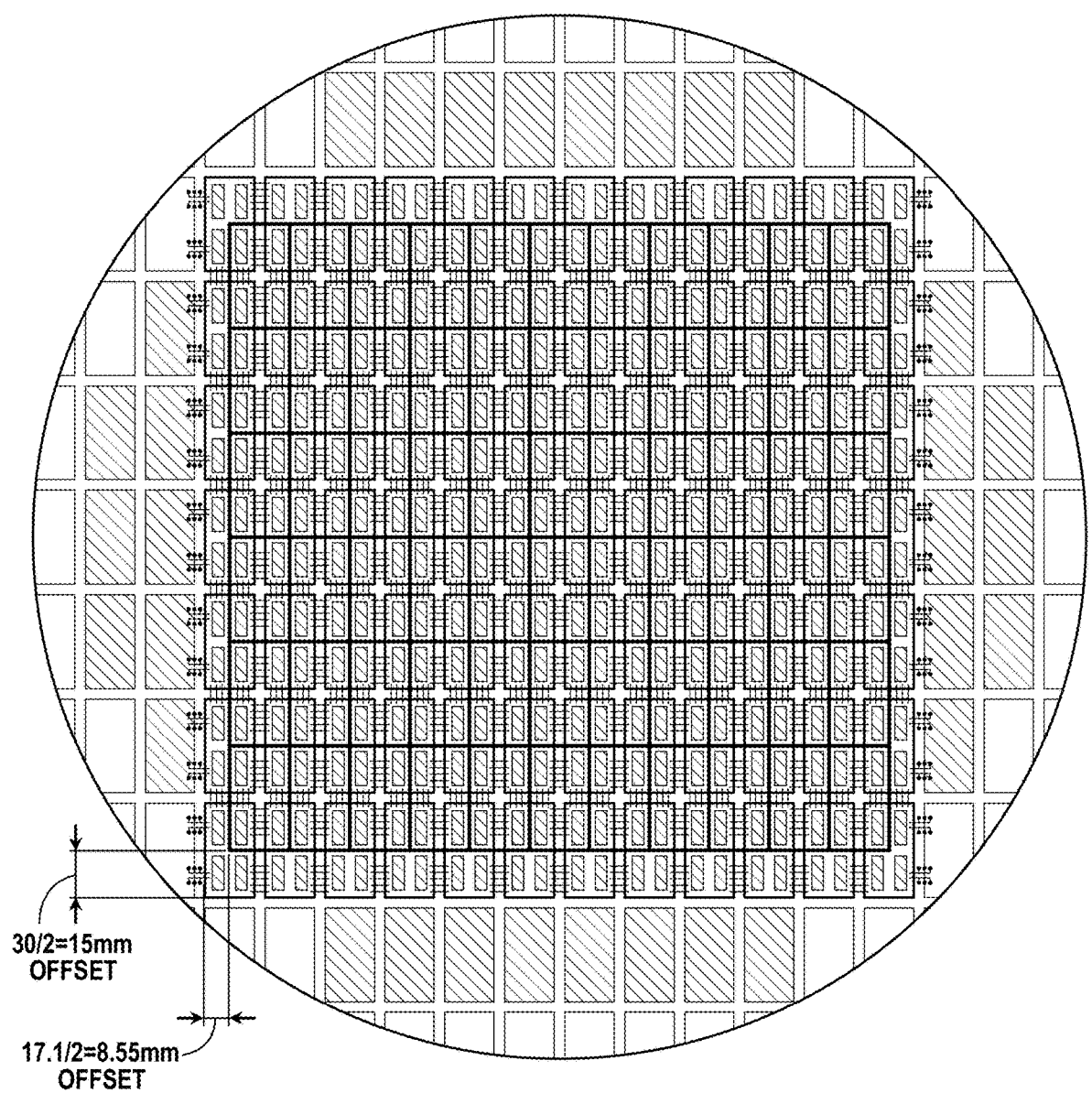
FIG. 4A-4G illustrate several schematics of a semiconductor substrate during exposure processes and size reduction in accordance with one or more embodiments of the present application.

In one implementation, without changing a size of a photomask, S230 functions to configure the lithography system to move in an offset position along an X-Y axis relative to a planar surface of the wafer in order to position the photomask that defines the geometries of the inter-die connections, as shown in FIG. 4A. Typically, the lithography system is configured to align with one or more alignment points of each die. Accordingly, during a lithography process a center point of a photomask used to expose circuitry geometries is aligned with a center point of the plurality of die while still allowing for an offset exposure of each individual to form the inter-die connections between adjacent pair of die. In some embodiments, a center point of the light source providing light for the exposure may additionally be in alignment with the center points of the photomask as well as the die. Additionally, or alternatively, there may be several alignment points that may be used to align a die, photomask, and light source.

Further, in this implementation, S230 may configure the lithography system to offset a specific pitch in multiple directions of a single die in order to expose between die that are adjacent the single die. For instance, in the circumstance that a given die is positioned in an interior of a wafer, the given die may surround up to four or more additional die. Thus, the establish connectivity between the given die and the surrounding die, the lithography system may be configured to move in an offset manner from a center or alignment points of the given die. Thus, the lithography system, in this example, may move a same pitch in the positive and negative Y-direction and a same pitch in the positive and negative X-direction to establish inter-die connections between the given die and the surrounding die. Accordingly, S230 may function to configure the lithography system differently according to a number of inter-die connection regions that exist between a given die and surrounding die.

In a second implementation, rather than offsetting a position of the photomask or lithography system relative to a die, S230 may function to provide a larger photomask that is sufficiently large such that an exposure may be performed in an inter-die connection region that exists between die. As mentioned previously, an inter-die connection region may additionally include some portions of the circuitry fabrication region of a die. In this way, if the photomask is sufficiently large, it may be possible to expose all inter-die connection regions surrounding a given die such that deposition of inter-die connection material may be deposited at the same time to establish connections of the given die to multiple surrounding die.

Additionally, or alternatively, the photomask may be enlarged with respect to at least one side (or more than one side but not all sides of the photomask) such that an exposure for inter-die connections may be made for at least one side (e.g., a right side) of a given die before the photomask must be replaced with another photomask that is designed for exposure for inter-die connections of another side (e.g., a left side) of the given die. Additionally, or alternatively, the photomask may be enlarged with respect to all sides such that an exposure for inter-die connections may be made for all sides of a given die (e.g., a multi-exposure process).

In a third implementation, S230 may function to configure the lithography system and/or provide a photomask that produce exposures with varying topologies. For instance, S230 may configure the lithography system and/or provide a photomask that enables a star topology exposure that allows the fabrication of inter-die connections between a plurality of die in a star topology configuration.

Additionally, or alternatively, S230 may configure the lithography system to provide exposures for fabricating the inter-die connections either over alignment and/or process features that may lie in the seal region and/or region between a pair of die on the wafer. Accordingly, in some embodiments, the inter-die connections are fabricated at locations that avoid blocking access to the alignment and process features that enable testing and alignment of the wafer and/or other processing devices.

In a fourth implementation, S230 may function to configure the lithography system to adjust an angle positioning of a light source of the lithography system to project light through a photomask to expose geometries for inter-die connections onto the semiconductor substrate. In such implementation, the photomask may be maintained in an original alignment (e.g., circuitry fabrication alignment) with the die and thus, offsetting or repositioning the photomask may not be necessary.

In a fifth implementation, S230 may function to implement a stitching technique to fabricate each of the plurality of inter-die connections between adjacent pair of die. In a preferred embodiment, S230 may function to set a first photoreticle in a positioned centered over a first die of an adjacent die pair and set a second photoreticle in a positioned centered over a second die of the adjacent die pair, as shown by way of example in FIGS. 4E-4F. In such preferred embodiment, the first photoreticle and the second photoreticle may have overlapping sections that overlap at least at a region (e.g., scribe line region, etc.) between the adjacent pair of die.

In such fifth implementation, once the first photoreticle is set into position, S230 may function to use the lithography system to expose the first photoreticle and once the second photoreticle is set into position, S230 may function to expose the second photoreticle. Preferably, the first and the second photoreticle include complementary geometries for stitching together inter-die connections in an overlapping manner. That is, the first photoreticle may include a first geometry for fabricating a first portion comprising a first layer of conductive material for a given inter-die connection. The second photoreticle may include a second geometry for fabricating a second portion comprising a second layer of conductive material for the given inter-die connection. After the second exposure of the second photoreticle, the second portion may function to overlap the first portion thereby creating a composited or stitched inter-die connection between the adjacent pair of die.

Preferably, a width at a distal end of the first portion may be diminished with respect to a width of a proximal end of the first portion nearest or positioned on the first die. Similarly, a width at a distal end of the second portion may be diminished with respect to a width of a proximal end of the second portion nearest or positioned on the second die of an adjacent pair. The respective sections of the first portion and the second portion may be positioned so that they overlap and join together, as shown by way of example in FIG. 4G. Once joined, the conductive material at the overlapping section of the joint may function to expand to achieve a width that is a same or substantially the same as a width at the proximal ends of each respective portions.

Figure 3D:
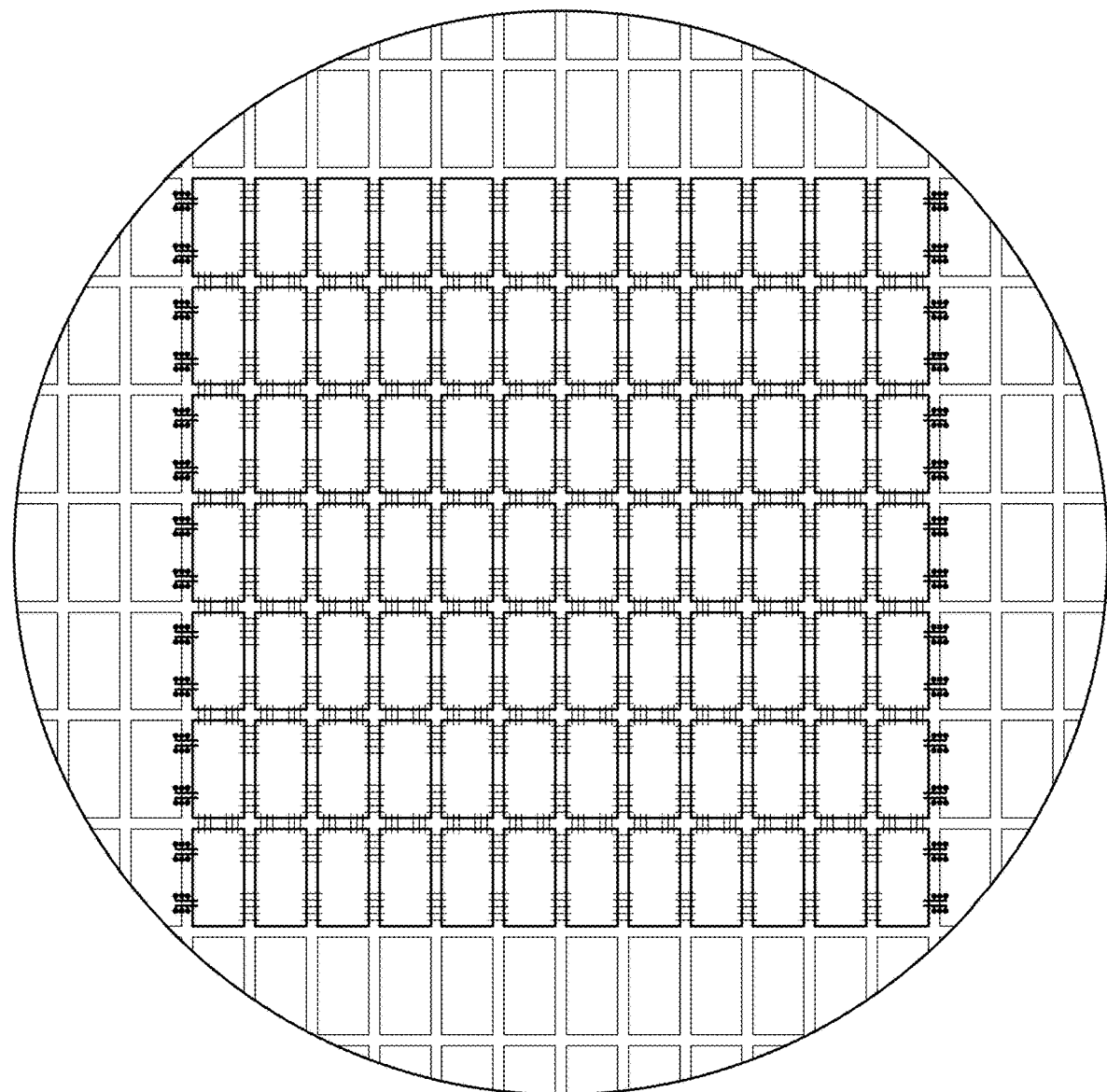
Figure 4B:
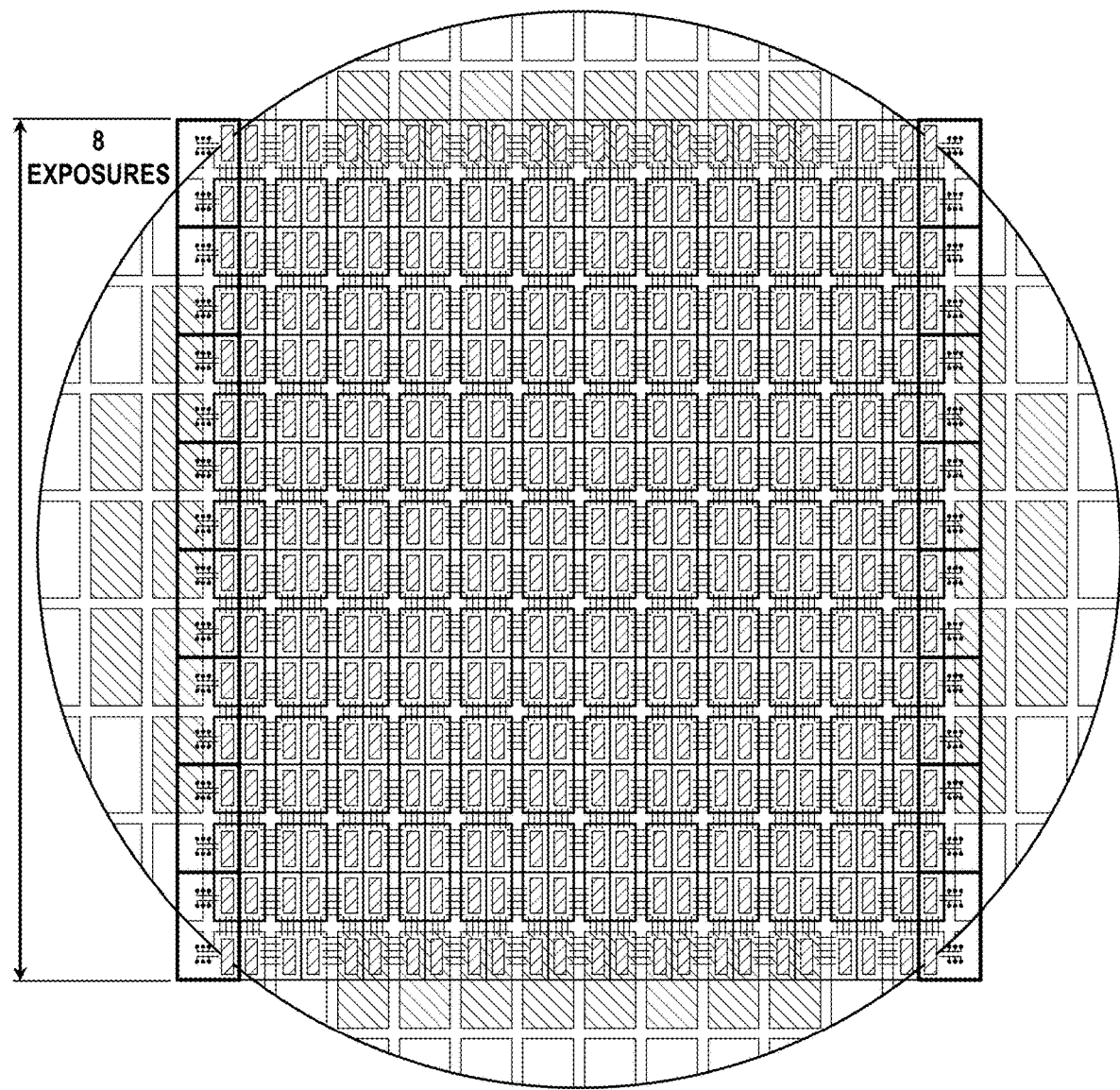

As shown in FIG. 4B, S230 may additionally function to configure the lithography system to expose the outer perimeter of the plurality of die at the periphery of the semiconductor substrate for fabricating connections to a system (e.g., fan-outs, die-to-system interconnect, as shown in FIG. 3D). The resulting die-to-system interconnect may span from die on the outer periphery of the semiconductor substrate to connect with one or more system components that may be positioned off of the substrate, as shown in FIG. 3Bs.

Figure 4C:
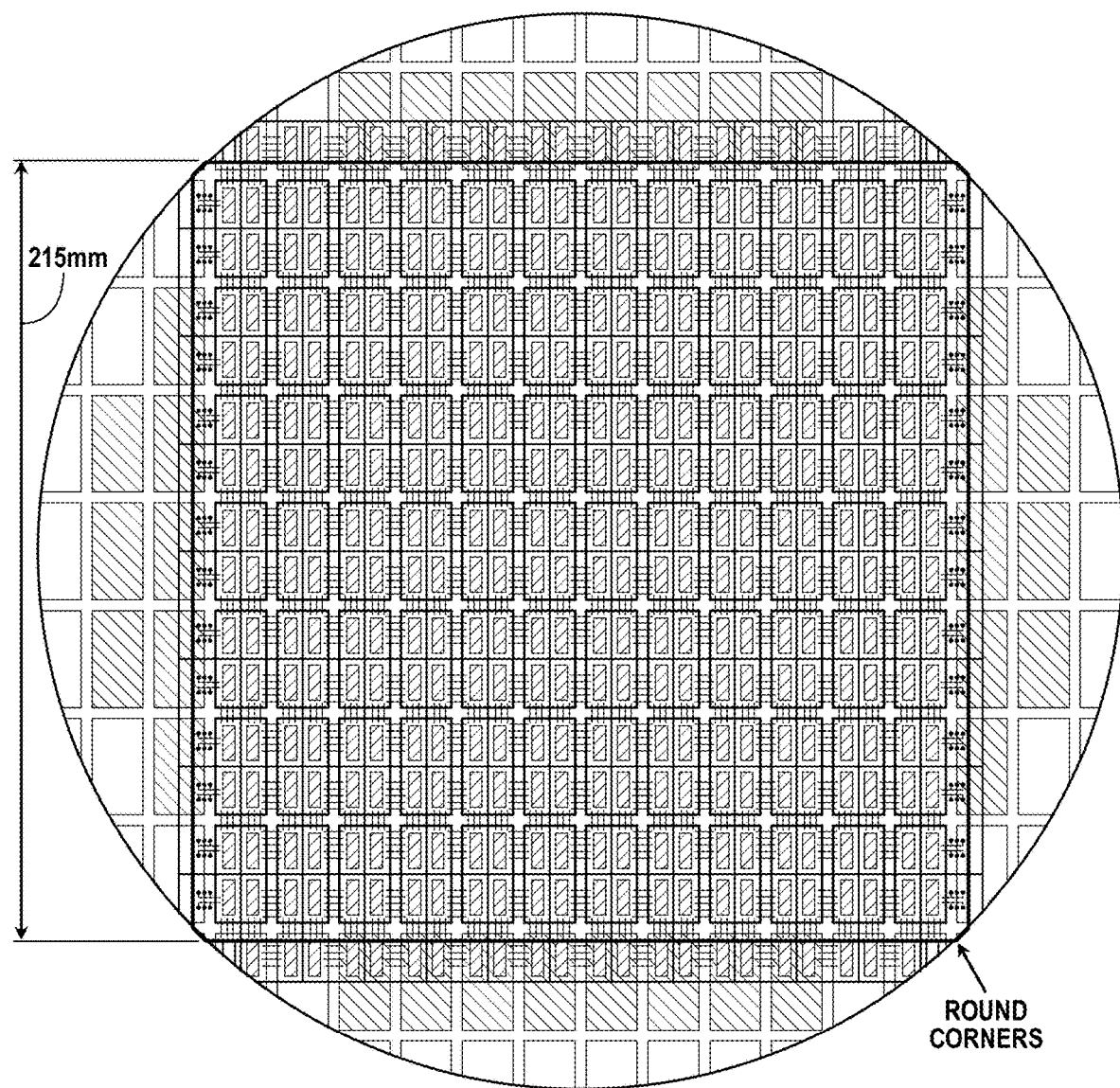
Figure 4D:
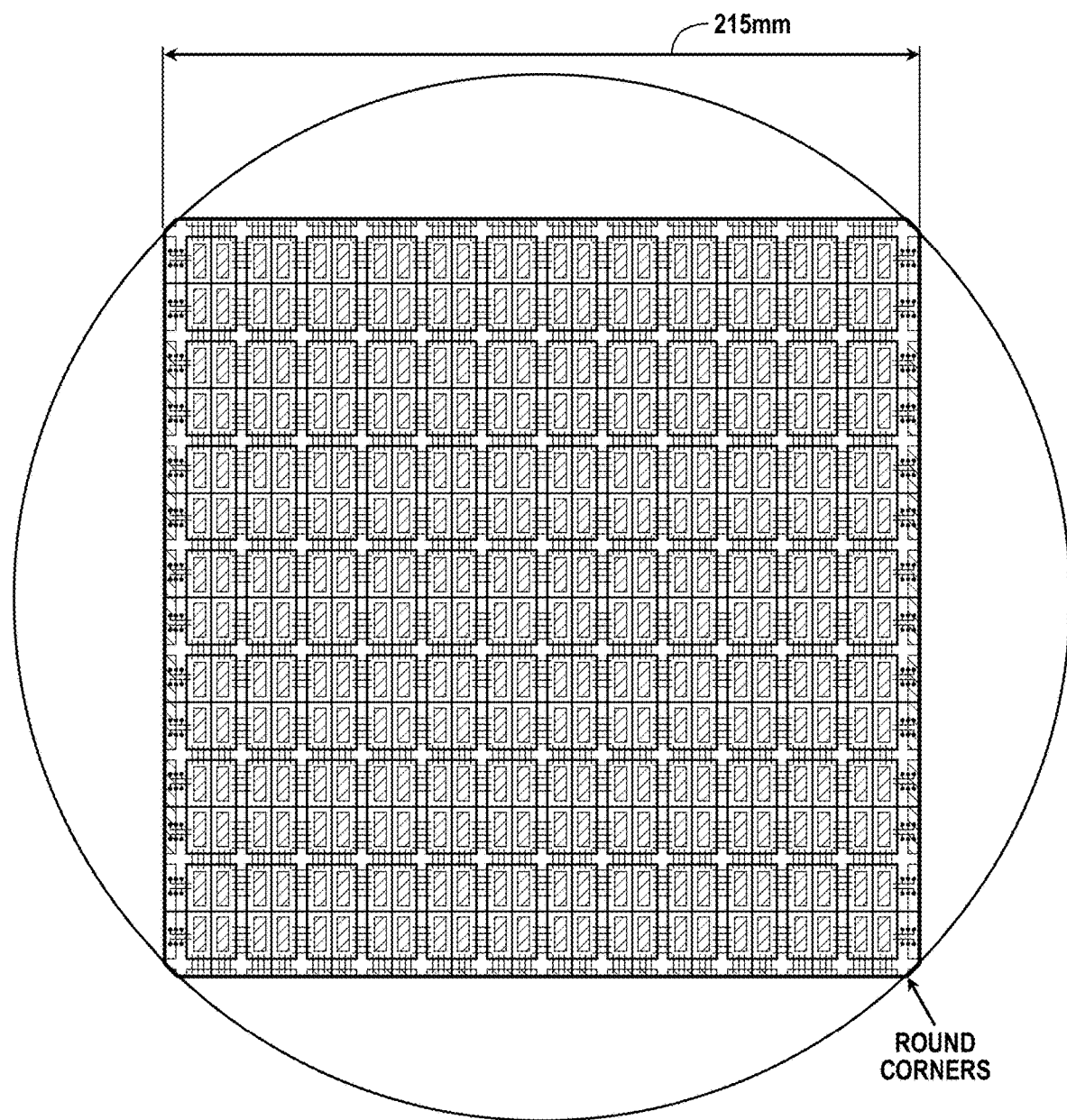
Figure 4E:
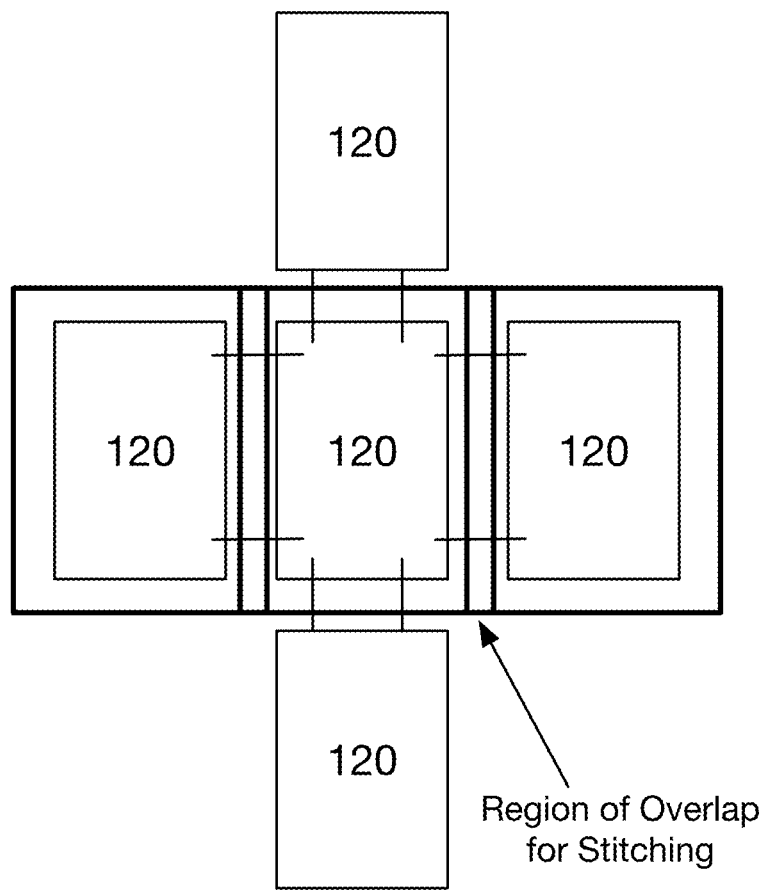
Figure 4F:
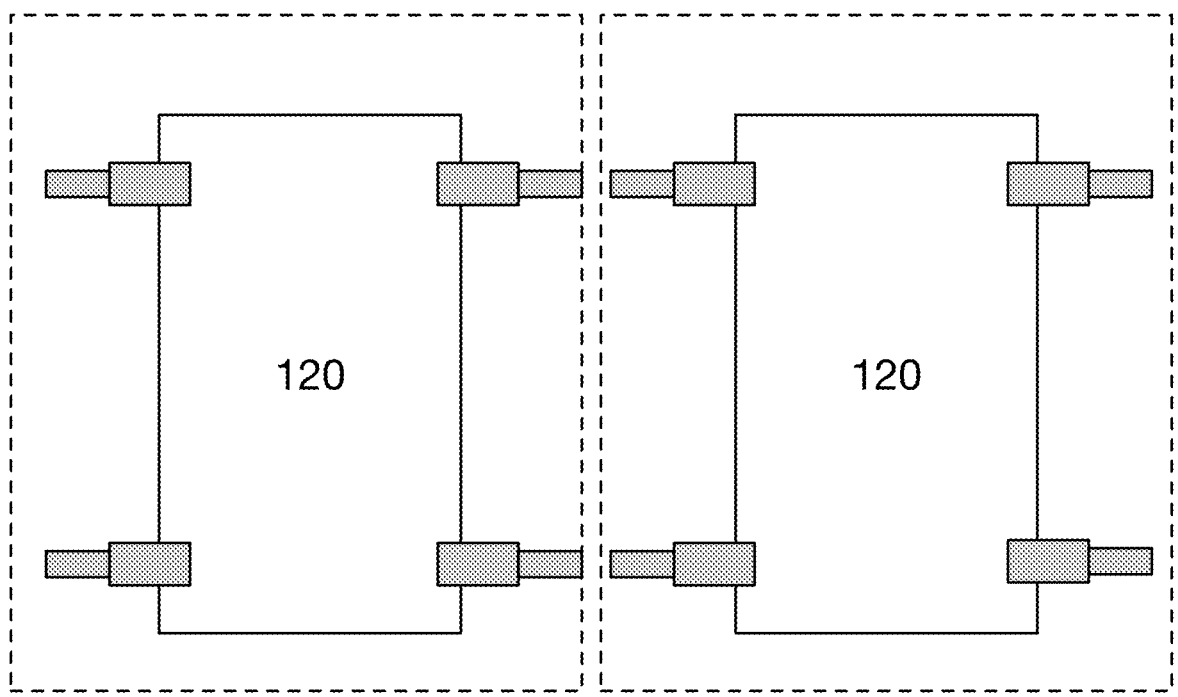
Figure 4G:
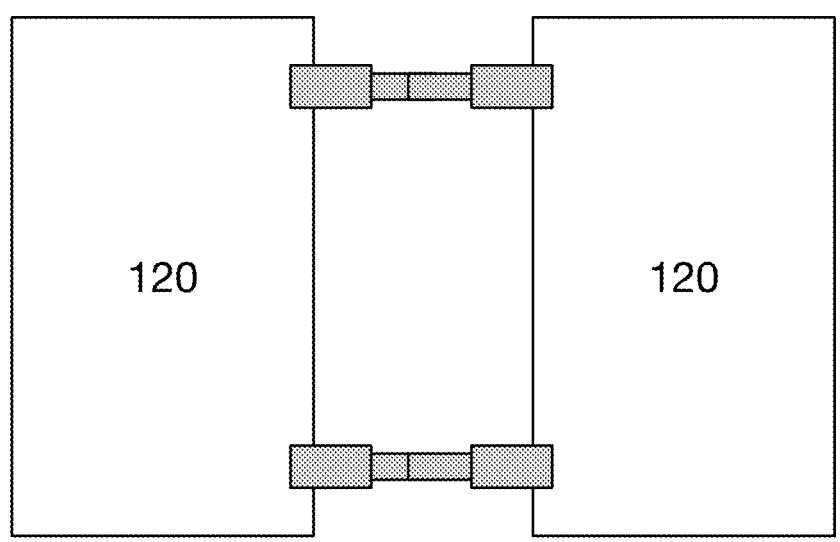

S240, which includes reducing a size of the semiconductor substrate, functions to reduce the semiconductor to a size that includes the plurality of die with circuitry and inter-die connections as well as the die-to-system interconnections. The general reduction size of the semiconductor substrate may generally be determined in S215 and may be adjusted slightly to include the die-to-system interconnections, as shown in FIG. 4C. Resultantly, S240 cuts from the semiconductor substrate the excess or unused die and provides a reduced semiconductor substrate, as shown in FIG. 4D, for additional computer chip manufacturing processes (e.g., chip packaging, etc.).

It shall be understood that the method 200 is an exemplary method that may be implemented in any suitable order to achieve the inventions and/or embodiments of the inventions within the purview or that may be easily contemplated in view of the disclosure provided herein. Thus, the order and process steps should not be limited to the exemplary order provided herein.

The methods of the preferred embodiment and variations thereof can be embodied and/or implemented at least in part as a machine configured to receive a computer-readable medium storing computer-readable instructions. The instructions are preferably executed by computer-executable components preferably integrated with the lithography system and one or more portions of the processors and/or the controllers implemented thereby. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods, apparatus, and systems described herein.

As a person skilled in the art will recognize from the previous detailed description and from the figures and claims, modifications and changes can be made to the preferred embodiments of the invention without departing from the scope of this invention defined in the following claims.

What is claimed is:

1. A semiconductor wafer comprising:
   a body, the body of the semiconductor wafer comprising a single, continuous substrate formed with semiconductor material;
   a plurality of distinct die lithographically formed within the body of the semiconductor wafer, wherein each of the plurality of distinct die is integrally formed with the semiconductor material of the body of the semiconductor wafer and is not diced from the body; and
   a plurality of inter-die circuit connections that each:
   (i) extend across the semiconductor wafer and (ii) connect distinct pairs of die of the plurality of distinct die formed within the body of the semiconductor wafer, wherein a subset of the plurality of distinct die defines one or more peripheral regions of the semiconductor wafer, each of a second plurality of circuit connections having a first end connected to an active circuitry layer of each of one or more die of the subset and having a second end extending to one or more off-die devices.

2. The semiconductor wafer according to claim 1, wherein at a time of forming the plurality of inter-die circuit connections, each of the plurality of distinct die are maintained as continuous parts of the body of the semiconductor wafer.

3. The semiconductor according to claim 1, further comprising:
   a circuitry layer at each of the plurality of distinct die, wherein the plurality of inter-die circuit connections connect circuitry layers of the distinct pairs of die.

4. The semiconductor wafer according to claim 1, further comprising:
   a protective barrier that (1) is applied to peripheral regions of each of the plurality of distinct die and (2) encapsulates each respective die of the plurality of distinct die other than a circuitry layer of the respective die.

5. The semiconductor wafer according to claim 1, wherein the plurality of distinct die of the semiconductor wafer include:
   (i) a first subset of interior die of the plurality of distinct die defining an interior of the semiconductor wafer, and
   (ii) a second subset of peripheral die of the plurality of distinct die defining a periphery of the semiconductor wafer, wherein fan-out circuit connections extend from the second subset of peripheral die.

6. The semiconductor wafer according to claim 1, wherein the semiconductor wafer comprises an un-partitioned substrate at a time when the plurality of inter-die circuit connections are fabricated along the semiconductor wafer.

7. The semiconductor wafer according to claim 1, wherein:
   each of the plurality of inter-die circuit connections comprises a single trace or a single wire that connects only two die of the plurality of distinct die formed within the body of the semiconductor wafer.

8. The semiconductor wafer according to claim 1, wherein:
   each of the plurality of inter-die circuit connections comprises a conductive material that enables a transmission of signals between circuit layers of pairs of die of the plurality of distinct die.

9. A method of fabricating the semiconductor wafer according to claim 1 comprising:
   providing the semiconductor wafer.

10. A method of fabricating a semiconductor wafer comprising:
    providing a semiconductor wafer having:
    a body, the body of the semiconductor wafer comprising a single, continuous substrate formed with semiconductor material;
    a plurality of distinct die lithographically formed within the body of the semiconductor wafer, wherein each of the plurality of distinct die is integrally formed with the semiconductor material of the body of the semiconductor wafer and is not diced from the body; and
    a plurality of inter-die circuit connections that each:
    (i) extend across the semiconductor wafer and (ii) connect distinct pairs of die of the plurality of distinct die formed within the body of the semiconductor wafer;
    wherein a subset of the plurality of distinct die defines one or more peripheral regions of the semiconductor wafer, each of a second plurality of circuit connections having a first end connected to an active circuitry layer of each of one or more die of the subset and having a second end extending to one or more off-die devices.

11. The method according to claim 10, further comprising:
    providing a protective barrier at each of the plurality of distinct die that surrounds an active circuit region of each of the plurality of distinct die.

12. The method according to claim 10, further comprising:
    providing a protective barrier that:
    (1) is applied to peripheral regions of each of the plurality of distinct die, and
    (2) encapsulates each respective die of the plurality of distinct die other than a circuitry layer of the respective die.

13. The method according to claim 10, further comprising:
    identifying a largest usable geometry of the semiconductor wafer that includes an array of or a subset of the plurality of distinct die; and
    fabricating a circuitry layer only at each of the plurality of distinct die within the identified largest usable geometry.

14. The method according to claim 10, further comprising:
fabricating one or more circuitry layers on each of the plurality of distinct die formed within the body of the semiconductor wafer.

15. The method according to claim 10, wherein:
each of the plurality of inter-die circuit connections extend from a first circuitry circuitry region of a first die of a pair of die formed within the body of the semiconductor wafer to a second circuitry region of a second die of the pair of die.

16. The method according to claim 10, further comprising:
fabricating the plurality of inter-die circuit connections including:
setting a position of a die reticle overlapping a first circuitry region of a first die of each distinct pair of die of the plurality of distinct die and a second circuitry region of a second die of each distinct pair of die, wherein the die reticle comprises geometries for forming the plurality of inter-die circuit connections; and
upon setting the die reticle into position, exposing by a lithography system the die reticle thereby forming the plurality of inter-die circuit connections between each distinct pair of die.

17. The method according to claim 10, further comprising:
fabricating the plurality of inter-die circuit connections including:
setting a position of a first die reticle over a first die of each distinct pair of die;
setting a position of a second die reticle over a second die of each distinct pair of die,
wherein the position of the second die reticle overlaps a portion of the first die reticle, and
wherein the first die reticle and the second die reticle comprise geometries for forming the plurality of inter-die circuit connections between each distinct pair of die;
upon setting the first die reticle into position, exposing by a lithography system the first die reticle thereby forming a first portion of each of the plurality of inter-die circuit connections between each distinct pair of die; and
upon setting the second die reticle into position, exposing by the lithography system the second die reticle thereby forming a second portion of each of the plurality of inter-die circuit connections between the pair of die.

18. The method according to claim 10, wherein:
each of the plurality of inter-die circuit connections is defined by an overlap of a first layer of conductive material and a second layer of conductive material.

19. The method according to claim 10, further comprising:
moving a photomask in an offset manner relative to a target die of the plurality of distinct die to create inter-die circuit connections between the target die and a plurality of die surrounding the target die.

20. A method of fabricating a semiconductor wafer comprising:
providing a semiconductor wafer having:
a body, the body of the semiconductor wafer comprising a single, continuous substrate formed with semiconductor material;
a plurality of distinct die lithographically formed within the body of the semiconductor wafer, comprising:
moving a photomask in an offset manner relative to a target die of the plurality of distinct die to create inter-die circuit connections between the target die and a plurality of die surrounding the target die,
wherein each of the plurality of distinct die is integrally formed with the semiconductor material of the body of the semiconductor wafer and is not diced from the body; and
a plurality of inter-die circuit connections that each:
(i) extend across the semiconductor wafer and (ii) connect distinct pairs of die of the plurality of distinct die formed within the body of the semiconductor wafer.

* * * * *